United States Patent
Butler et al.

(10) Patent No.: US 7,936,443 B2
(45) Date of Patent: May 3, 2011

(54) LITHOGRAPHIC APPARATUS AND DEVICE MANUFACTURING METHOD

(75) Inventors: Hans Butler, Best (NL); Frank Auer, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 307 days.

(21) Appl. No.: 11/430,181

(22) Filed: May 9, 2006

(65) Prior Publication Data

US 2007/0263189 A1 Nov. 15, 2007

(51) Int. Cl.
*G03B 27/42* (2006.01)

(52) U.S. Cl. ........................................................ 355/53

(58) Field of Classification Search .................. 355/53, 355/72, 75, 55
See application file for complete search history.

(56) References Cited

U.S. PATENT DOCUMENTS

| | | | |
|---|---|---|---|
| 4,383,757 A * | 5/1983 | Phillips ............................ | 355/53 |
| 5,801,832 A | 9/1998 | Van Den Brink | |
| 5,953,105 A | 9/1999 | Van Engelen et al. | |
| 6,020,964 A | 2/2000 | Loopstra et al. | |
| 6,046,792 A | 4/2000 | Van Der Werf et al. | |
| 6,122,058 A | 9/2000 | Van Der Werf et al. | |
| 6,208,407 B1 | 3/2001 | Loopstra | |
| 6,322,060 B1 | 11/2001 | Mayama et al. | |
| 6,441,884 B1 * | 8/2002 | Takahashi et al. ............. | 355/53 |
| 6,522,388 B1 * | 2/2003 | Takahashi et al. ............. | 355/53 |
| 6,538,720 B2 * | 3/2003 | Galburt et al. ................. | 355/53 |
| 6,590,639 B1 * | 7/2003 | Yuan et al. ..................... | 355/75 |
| 6,750,949 B2 | 6/2004 | Loopstra et al. | |
| 6,788,386 B2 | 9/2004 | Cox et al. | |
| 6,819,400 B2 | 11/2004 | Ravensbergen | |
| 6,879,375 B1 * | 4/2005 | Kayama .......................... | 355/53 |
| 6,977,713 B2 | 12/2005 | Luttikhuis et al. | |
| 7,049,592 B2 | 5/2006 | Franken et al. | |
| 2002/0149754 A1 * | 10/2002 | Auer et al. ...................... | 355/53 |
| 2003/0053035 A1 * | 3/2003 | Butler et al. .................... | 355/53 |
| 2003/0117596 A1 * | 6/2003 | Nishi ............................... | 355/51 |
| 2003/0117600 A1 | 6/2003 | Taniuchi et al. | |
| 2003/0197914 A1 * | 10/2003 | Cox et al. ...................... | 359/223 |
| 2004/0000215 A1 * | 1/2004 | Phillips et al. .................. | 74/574 |
| 2004/0178354 A1 * | 9/2004 | Visscher ................. | 250/442.11 |
| 2004/0257549 A1 | 12/2004 | Leenders et al. | |
| 2005/0083500 A1 | 4/2005 | Franken | |

(Continued)

FOREIGN PATENT DOCUMENTS

| | | |
|---|---|---|
| EP | 1 380 899 A2 | 1/2004 |
| EP | 1 950 793 A1 | 7/2008 |
| GB | 2299867 A | 10/1996 |
| JP | 08288198 A * | 11/1996 |
| JP | 2001102286 A * | 4/2001 |

(Continued)

OTHER PUBLICATIONS

Machine translation of JP 2005-079373, retrieved Dec. 9, 2009.*

(Continued)

*Primary Examiner* — Hung Henry Nguyen
*Assistant Examiner* — Steven H Whitesell-Gordon
(74) *Attorney, Agent, or Firm* — Sterne, Kessler, Goldstein & Fox P.L.L.C.

(57) ABSTRACT

Data from the piezo-electric sensors in the mounts for the projection system can be used in the control loops for other parts of the lithographic apparatus, for example the mask table, the substrate table or the air mounts for the frame bearing the projection system. Information from, for example, a geophone, which is used to measure the absolute velocity of the frame bearing the projection system, can be used in the control loop for the piezo-electric actuator in the mount for the projection system.

9 Claims, 4 Drawing Sheets

U.S. PATENT DOCUMENTS

| | | |
|---|---|---|
| 2005/0140950 A1 | 6/2005 | Franken et al. |
| 2006/0139613 A1 | 6/2006 | Houkes et al. |
| 2007/0097367 A1 | 5/2007 | Sakamoto |
| 2008/0074629 A1 | 3/2008 | Groeneveld et al. |

FOREIGN PATENT DOCUMENTS

| | | | |
|---|---|---|---|
| JP | 2005079373 A | * | 3/2005 |
| WO | WO 2007/040254 A1 | | 4/2007 |

OTHER PUBLICATIONS

International Search Report for Appln. No. PCT/NL2007/000239 mailed Dec. 17, 2007, 2pgs.

Non-Final Rejection mailed Dec. 15, 2008 for U.S. Appl. No. 11/527,729, filed Sep. 27, 2006, 10 pgs.

Final Rejection mailed Jun. 9, 2009 for U.S. Appl. No. 11/527,729, 11 pgs.

* cited by examiner

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The projection system used for projecting the patterned beam of radiation onto a target portion of the substrate is supported on a frame by a mount. The mount includes piezo-electric actuators and piezo-electric sensors, generally arranged in series with each other. The piezo-electric sensor measures the total force applied to the projection system and the detected force is used as part of a feedback loop for the piezo-electric actuator such that the forces on the projection system are minimized. By minimizing the forces on the projection system it remains substantially stationary. However, if the frame supporting the projection system and/or the substrate table and/or the support for the patterning device move or vibrate while the projection system remains stationary alignment errors could result.

SUMMARY

It is desirable to reduce alignment errors resulting from the misalignment of the PL and other parts of the lithographic apparatus.

According to an embodiment of the invention, there is provided a lithographic apparatus including a projection system configured to project a patterned beam onto a target portion of a substrate, a frame constructed to hold the projection system, a mount constructed to support the projection system on the frame, the mount including a piezo-electric actuator constructed to apply a force to the projection system, and a sensor constructed to measure the position or a time derivative of the position of the frame, wherein the piezo-electric actuator is controlled based on the measured position or a time derivative of the position of the frame.

According to an embodiment of the invention, there is provided a device manufacturing method including projecting a patterned beam of radiation onto a target portion of a substrate using a projection system, holding the projection system using a frame, supporting the projection system on the frame using a mount, the mount including a piezo-electric actuator constructed to apply a force to the projection system, measuring the position or a time derivative of the position of the frame, and controlling the piezo-electric actuator based on the measured position or time derivative of the position of the frame.

According to an embodiment of the invention, there is provided a device manufacturing method including holding a patterning device for patterning a radiation beam using a support, holding a substrate using a substrate table, projecting a patterned beam of radiation onto a target portion of the substrate using a projection system, holding the projection system using a frame, supporting the projection system on the frame using a mount, the mount including a piezo-electric sensor for detecting the force applied to the projection system, and controlling the position of the support and/or the substrate table based on the detected force.

According to an embodiment of the invention, there is provided a lithographic apparatus including a projection system configured to project a patterned beam onto a target portion of a substrate, a frame constructed to hold the projection system, a mount constructed to support the projection system on the frame, the mount including a piezo-electric sensor constructed to detect the force applied to the projection system, a second mount constructed to support the frame and minimize vibration of the frame, wherein the vibration of the frame is minimized by controlling the second mount based on the detected force.

According to an embodiment of the invention, there is provided a device manufacturing method including projecting a patterned beam of radiation onto a target portion of the substrate using a projection system, holding the projection system using a frame, supporting the projection system on the frame using a mount, the mount including a piezo-electric sensor for detecting the force applied to the projection system, supporting the frame and minimizing vibrations of the frame using a second mount, and controlling the second mount to minimize the vibration of the frame based on the detected force.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
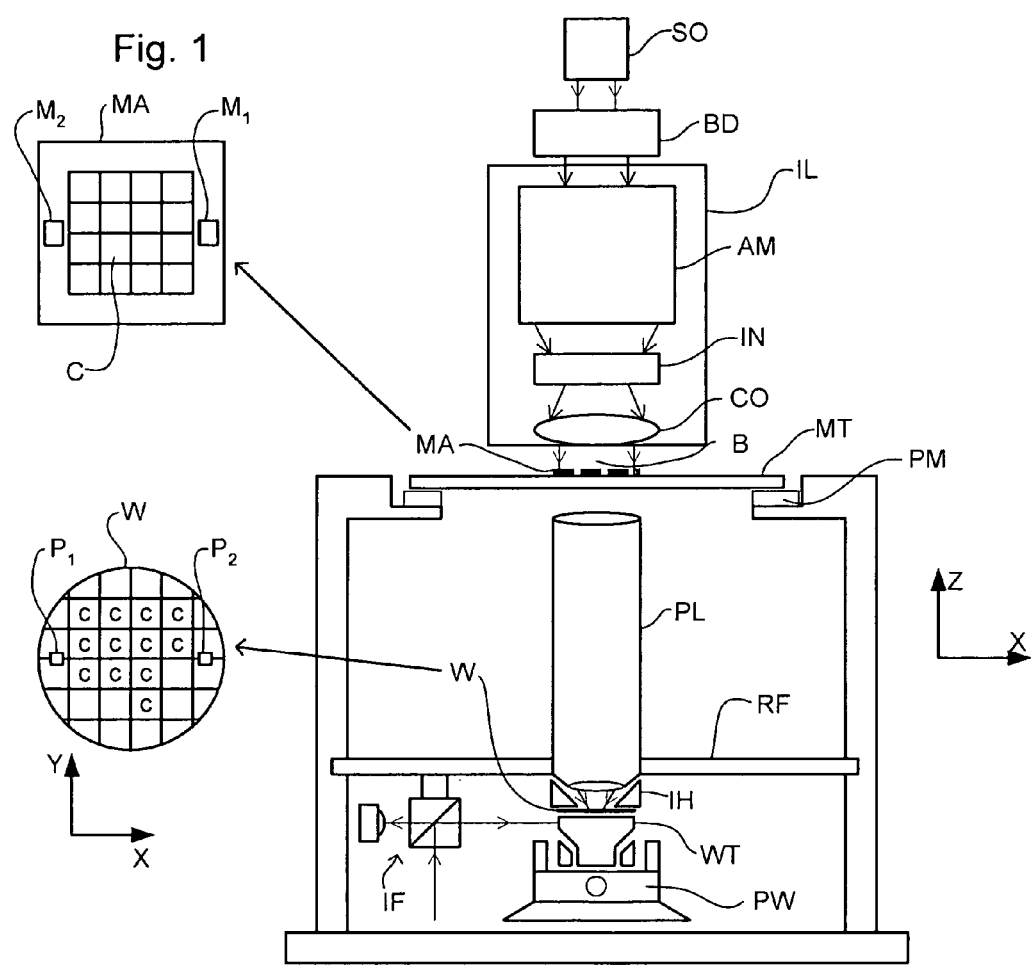
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation), a support structure (e.g. a mask table) MT constructed to support a patterning device (e.g. a mask) MA and connected to a first positioner PM configured to accurately position the patterning device in accordance with certain parameters, a substrate table (e.g. a wafer table) WT constructed to hold a substrate (e.g. a resist-coated wafer) W and connected to a second positioner PW configured to accurately position the substrate in accordance with certain parameters, and a projection system (e.g. a refractive projection lens system) PL configured to project a pattern imparted to the radiation beam B by patterning device MA onto a target portion C (e.g. including one or more dies) of the substrate W. The projection system is mounted to the reference frame RF.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. FIG. 1 shows a liquid supply system IH that is configured to supply liquid between a last optical element of the projection system PL and the substrate W. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
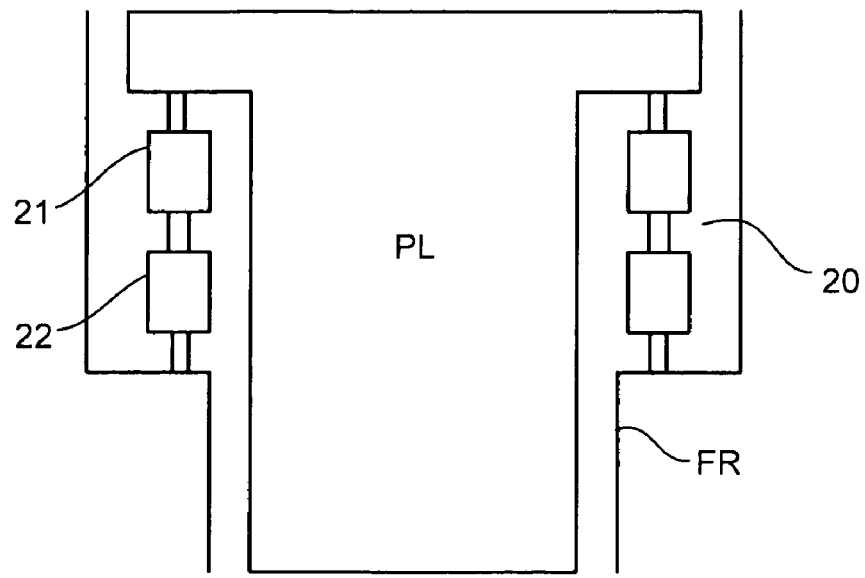
FIG. 2 is a detailed view of a conventional mount for the projection system.

FIG. 2 depicts a mount 20 configured to support a projection system PL on a frame FR. The mount 20 includes two parts, a piezo-electric actuator 22 and a piezo-electric sensor 21 arranged in series with each other. The piezo-electric sensor detects the force applied to the projection system PL and the detected force is used as an input for a control loop for the piezo-electric actuator. The control loop functions to minimize the forces applied to the projection system PL and thus keep the projection system stationary. The mount 20 can thus also be used to reduce vibrations of the projection system PL and introduce a stiffness k and damping d into the mount. Each piezo-electric actuator 22 can provide a force in a vertical and tangential (to the central axis of the projection system) direction. There are a plurality of mounts 20, preferably at least three mounts, arranged circumferentially around the projection system PL thus the projection system PL is capable of being moved in six directions, X, Rx, Y, Ry, Z and Rz.

Figure 3:
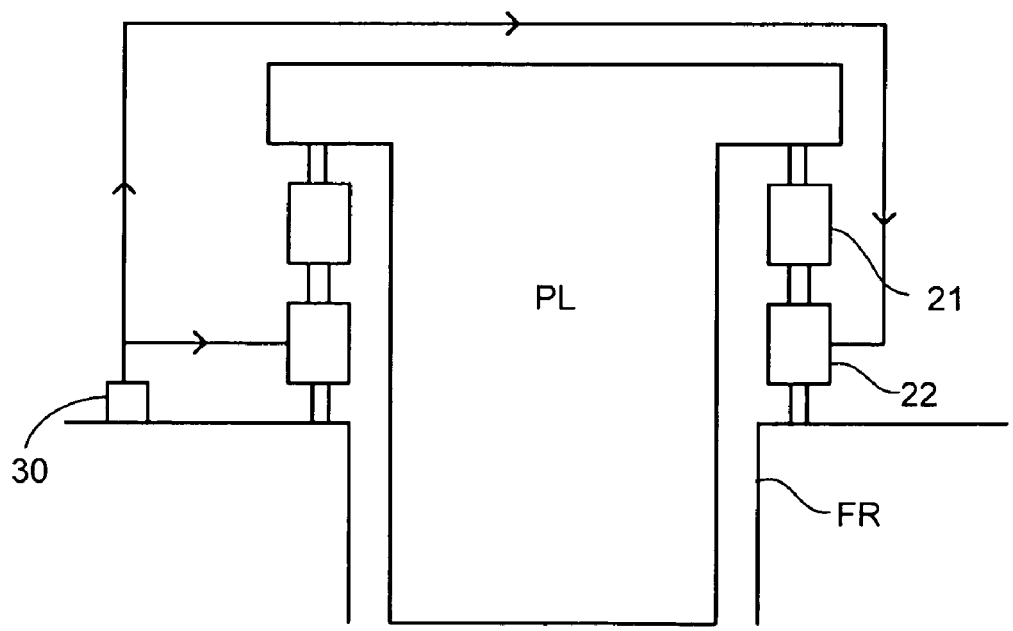
FIG. 3 depicts a mount to support a frame of the projection system in accordance with an embodiment of the invention.

In the apparatus depicted in FIG. 3 a geophone 30 is mounted on frame FR. Although a geophone is used in this example any device which measures the absolute velocity, position or acceleration of the frame relative to a fixed point (e.g. an inertial mass) would be sufficient and this invention can be implemented using any form of motion sensor. Data from the geophone is fed into the control loop for the piezo-electric actuators 22. Thus, any movement of the frame FR will be detected and the projection system PL moved, using the piezo-electric actuators 22 accordingly. In an embodiment, element 30 is an acceleration sensor and the piezo-electric actuator is controlled based on the measured acceleration of the frame. Therefore if the frame FR moves the projection system PL should be moved similarly and this will reduce any misalignment between the projection system and the frame or any other object supported by the frame. This is particularly useful for low frequency vibrations of the frame FR.

Figure 4:
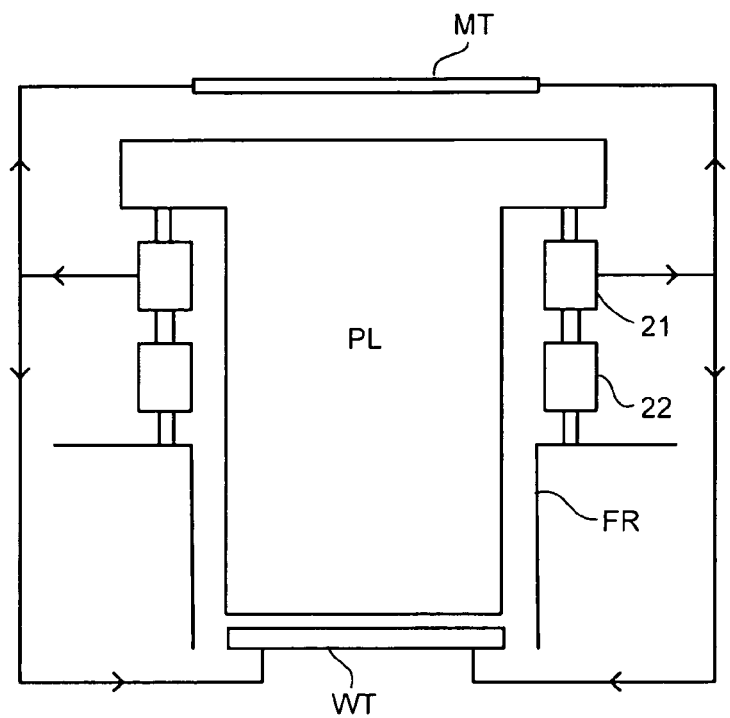
FIG. 4 depicts a mount to support a frame of the projection system in accordance with an embodiment of the invention.

FIG. 4 depicts an alternative embodiment of the invention in which data from the piezo-electric sensors 21 detecting the forces applied to the projection system is used in control loops to control the position of the substrate table WT bearing the substrate and/or the mask table MT supporting the mask. The forces applied to the projection system provide a measure of the force, and therefore the acceleration, of the projection system beyond the damping actions of the mount itself. Thus, the sensor can be used to detect the acceleration of the projection system and the substrate table and/or mask table controlled to follow the motion of the projection system accurately. The piezo-electric sensors 21 detect forces in six directions, and thus the acceleration of the projection system PL can be detected in six directions. Consequently, the conventional accelerometers that are used to measure the acceleration of the projection system, which only measure the acceleration in two directions (generally x and y), may be removed.

Although data from the piezo-electric sensor 21 has been described as being used in the control loops of the mask table MT and/or the substrate table WT the embodiment of the invention need not be limited to this and data from the piezo-electric sensors 21 could indeed be used in the control loop of any part of the lithographic apparatus.

Figure 5:
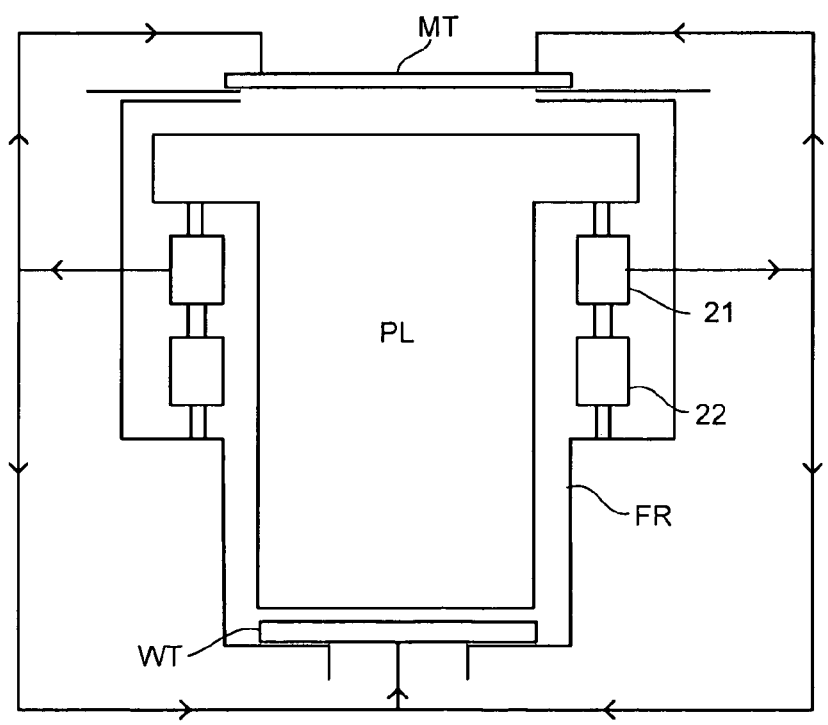
FIG. 5 depicts a mount to support a frame of the projection system in accordance with an embodiment of the invention.

FIG. 5 depicts an alternative embodiment in which the substrate table WT and mask table MT are depicted as being mounted on the frame FR. Nevertheless, data from the piezo-electric sensors 21 is still used in the control loops of the mask table and substrate table.

Figure 6:
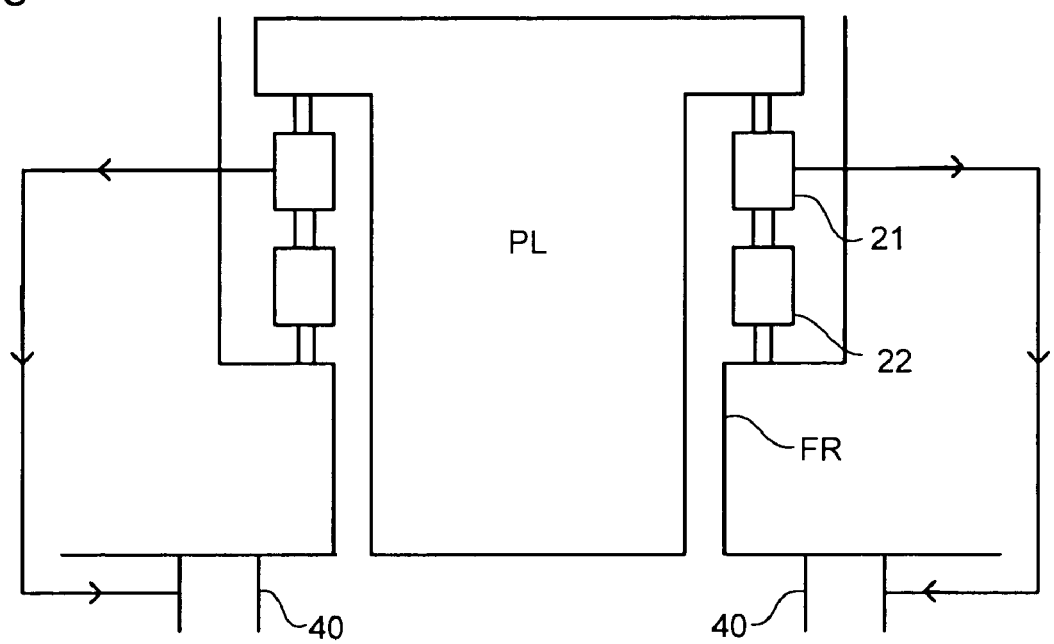
FIG. 6 depicts a mount to support a frame of the projection system in accordance with an embodiment of the invention.

FIG. 6 depicts an alternative embodiment in which the frame FR is supported on airmounts 40 which operate to reduce the vibrations of the frame FR. As can be seen, data from the piezo-electric sensors is fed into the control loop for the airmounts 40 which can be used to reduce the vibrations of the frame FR and thus improve alignment between the projection system and other parts of the lithographic apparatus. Although airmounts have been used as an exemplary embodiment any type of vibration isolators may be used such as electromagnetic mounts or elastic (e.g. rubber) mounts.

Although described here as distinct embodiments each of the embodiments can be combined with the other embodiments to produce an improved lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    a projection system configured to project a patterned beam onto a target portion of a substrate;
    a frame configured to hold said projection system;
    a mount configured to support said projection system on said frame, said mount comprising a piezo-electric actuator configured to apply a force to move said projection system; and
    a sensor configured to measure a position or a time derivative of the position of said frame,
    wherein said piezo-electric actuator is controlled based on the measured position or the time derivative of said position of said frame.

2. The lithographic apparatus according to claim 1, wherein said mount further comprises a piezo-electric sensor configured to measure a force between said frame and said projection system.

3. The lithographic apparatus according to claim 2, wherein said piezo-electric sensor is arranged in series with said piezo-electric actuator.

4. The lithographic apparatus according to claim 1, wherein said mount comprises a plurality of the piezo-electric actuators.

5. The lithographic apparatus according to claim 4, wherein said mount further comprises:
    a plurality of piezo-electric sensors configured to measure a force between said frame and said projection system, each respective one of the piezo-electric actuators being arranged in series with a corresponding one of the piezo-electric sensors.

6. The lithographic apparatus according to claim 1, wherein said sensor comprises a velocity sensor and wherein said piezo-electric actuator is controlled based on a measured velocity of said frame.

7. The lithographic apparatus according to claim 6, wherein said velocity sensor is a geophone.

8. The lithographic apparatus according to claim 1, wherein said sensor comprises an acceleration sensor and wherein said piezo-electric actuator is controlled based on a measured acceleration of said frame.

9. A device manufacturing method comprising:
    projecting a patterned beam of radiation onto a target portion of a substrate using a projection system;
    holding said projection system using a frame;
    supporting said projection system on said frame using a mount, said mount comprising a piezo-electric actuator constructed to apply a force to move said projection system;
    measuring a position or a time derivative of the position of said frame; and
    controlling said piezo-electric actuator based on the measured position or the measured time derivative of the position of said frame.

* * * * *